United States Patent [19]

Marschall et al.

[11] 4,278,949
[45] Jul. 14, 1981

[54] SEMICONDUCTOR LASER STRUCTURE AND MANUFACTURE

[75] Inventors: Peter Marschall, Neu-Ulm; Ewald Schlosser, Ulm; Claus Wölk, Erbach, all of Fed. Rep. of Germany

[73] Assignee: LICENTIA Patent-Verwaltungs-G.m.b.H., Frankfurt am Main, Fed. Rep. of Germany

[21] Appl. No.: 41,171

[22] Filed: May 21, 1979

[30] Foreign Application Priority Data

May 20, 1978 [DE] Fed. Rep. of Germany ....... 2822146

[51] Int. Cl.$^3$ .............................................. H01S 3/19
[52] U.S. Cl. .................................. 331/94.5 H; 357/88
[58] Field of Search .................... 331/94.5 H; 357/18, 357/88

[56] References Cited

U.S. PATENT DOCUMENTS

| | | | |
|---|---|---|---|
| 3,780,358 | 12/1973 | Thompson | 331/94.5 H |
| 3,946,334 | 3/1976 | Yonezu et al. | 331/94.5 H |
| 4,105,955 | 8/1978 | Mayashi et al. | 331/94.5 H |

Primary Examiner—James W. Davie
Attorney, Agent, or Firm—Spencer & Kaye

[57] ABSTRACT

In a semiconductor laser composed of a sequence of layers forming a heterostructure diode and including a substantially homogeneously doped layer defining a laser active zone having a laser radiation exit face perpendicular to the layers, the current flowing in the forward direction of the diode is constricted to a narrow, strip-shaped region in the laser active zone by providing a monocrystalline layer located in the layer sequence to be spaced from the active zone by at least one intervening, doped semiconductor layer, providing the surface of the monocrystalline layer directed away from the active zone with a trough-shaped recess extending essentially perpendicularly to said radiation exit face, and diffusing, via the surface provided with the recess, and toward the active zone, doping material which produces a doped region of same conductivity type as the intervening, doped layer, the doped region being delimited by a diffusion front substantially parallel, and corresponding in contour, to the surface provided with said recess, and located to provide a localized semiconductor region of a single conductivity type in the area below the recess and between the recess and said active zone, and semiconductive regions of respectively opposite conductivity types separated by the diffusion front in areas adjacent the localized region.

15 Claims, 10 Drawing Figures

SEMICONDUCTOR LASER STRUCTURE AND MANUFACTURE

BACKGROUND OF THE INVENTION

The present invention relates to a semiconductor laser of the type having a layer sequence formed as a heterostructure diode in which a substantially homogeneously doped laser active zone is enclosed on each of two sides by two semiconductor layers having respectively different dopings and provided with means for constricting the current flowing in the forward direction of the diode to a narrow strip-shaped region of the laser active zone.

The present invention further relates to a method for producing such a semiconductor laser.

When coupling light energy from a semiconductor laser into a light conductive fiber there generally occur losses which are mainly the result of mode mismatching between the laser and fiber. Generally, only one basic mode can propagate in a light conductive fiber whose core diameter is the order of magnitude of the wavelength of the emitted radiation, while the semiconductor lasers of known design emit radiation in a large number of modes.

Semiconductor lasers designed as heterostructure diodes are preferred for use in optical data transmission systems. The laser radiation from such a laser, which begins at a certain threshold current density, exists in a thin region lying between oppositely doped semiconductive layers, known as the laser active zone, in the laser resonator defined by the cleavage plane at the crystal ends. Due to the expanse of the active zone, which is small in a direction perpendicular to the plane of the wafer but generally large in a direction parallel to this plane, the exit surface for the laser radiation is substantially larger than the coupling-in surface of, for example, a light conductive fiber so that a high light energy level is required to compensate for the resulting losses.

However, semiconductor lasers are known in which means are provided for constricting the current flowing in the forward direction of the diode. For example, in Applied Physics Letters, Volume 18, No. 4, Feb. 15th, 1971, at pages 155-157, there is disclosed a semiconductor laser which is designed in the shape of a double heterostructure diode in which a first metallic contact contacts a first outer face of the semiconductor laser over its entire area and in which a second metallic contact is disposed on a second opposite face of the semiconductor laser, on an insulating layer disposed immediately therebelow, so that the current supply to the semiconductor body takes place only over a narrow strip on this second contact face.

Furthermore, the publication "Japanese Journal of Applied Physics, Volume 12, No. 10, October, 1973" discloses a GaAs-Al$_x$Ga$_{1-x}$ double heterostructure planar strip laser in which the excitation current is constricted by means of a narrow strip-shaped region of a p-conductive material. The p-channel is here formed by diffusion in through a strip-shaped window in a diffusion inhibiting mask 15, as shown in FIG. 1 of the present drawing, which can be removed again after the diffusion. As a result of what is in principle unavoidable lateral diffusion underneath the mask, the p-channel is wider than the window. The subsequent current flow is correspondingly widened so that the resulting laser emission is relatively wide as well as multimoded and unstable in the direction parallel to the active zone.

Narrow but transversally multimode lasers exhibit distinct nonlinearities in their light-current characteristics even at low light output power. These so-called "kinks" in the characteristics are caused by abrupt changes in the transversal mode distribution. The characteristic of such a laser is shown in FIG. 2. Such lasers are not suited for use as a transmitting light source in optical data transmission systems.

With these prior art approaches it has not yet been possible to satisfactorily achieve optical matching of a semi-conductor laser to for example, a light conductive fiber intended to further transmit the light, particularly a monomode fiber.

SUMMARY OF THE INVENTION

It is therefore an object of the present invention to provide a semiconductor laser having a transversal emission in the basic mode, capable of being manufactured with simple technology, and having a substantially linear light current characteristic and a low tendency to fluctuate.

This and other objects are accomplished according to the present invention by the provision of a monocrystalline layer in the layer sequence above one of the differently doped semiconductor layers or above an additional layer applied thereto, which monocrystalline layer is provided with trough-shaped recesses which extend from one surface thereof essentially perpendicularly to the exit face for the laser radiation, and semiconductor regions of different doping produced by the diffusion of doping material through the one surface of the monocrystalline layer, these regions being separated from one another by a diffusion front having a contour which corresponds to that of the one surface so that a semiconductor region of essentially the same conductivity type is formed below the trough-shaped recess and extends to the laser active zone.

Advisably the depth of the trough-shaped recess in the surface of the monocrystalline layer is at least of the order of magnitude of the width of the recess at the one surface, which width should here be <3μ. The shape of the trough should be as sharply defined as possible, preferably in the form of a V.

A particular advantage of the solution according to the invention is, that the contour given to the one surface of the monocrystalline layer permits a shaping of the profile of the diffusion front created in a subsequent diffusion step such that a deep constriction of the current path is realized.

Individual semiconductor lasers are generally manufactured by initially producing a large number of laser elements on a common substrate and thereafter separating the individual laser elements from one another.

Such a manufacturing method is also of advantage for producing embodiments of the present invention.

BRIEF DESCRIPTION OF THE DRAWING

FIGS. 1 and 2 have already been described in detail above.

DESCRIPTION OF THE PREFERRED EMBODIMENTS

EXAMPLE 1

FIGS. 3-7 are cross-sectional views along a plane parallel to the light emitting surface of the resulting semiconductor laser.

Figure 1:
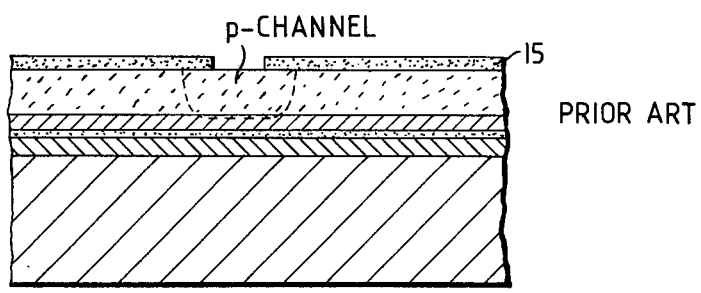
FIG. 1 is a cross-sectional view of an example of a semiconductor laser structure according to the prior art.
Figure 2:
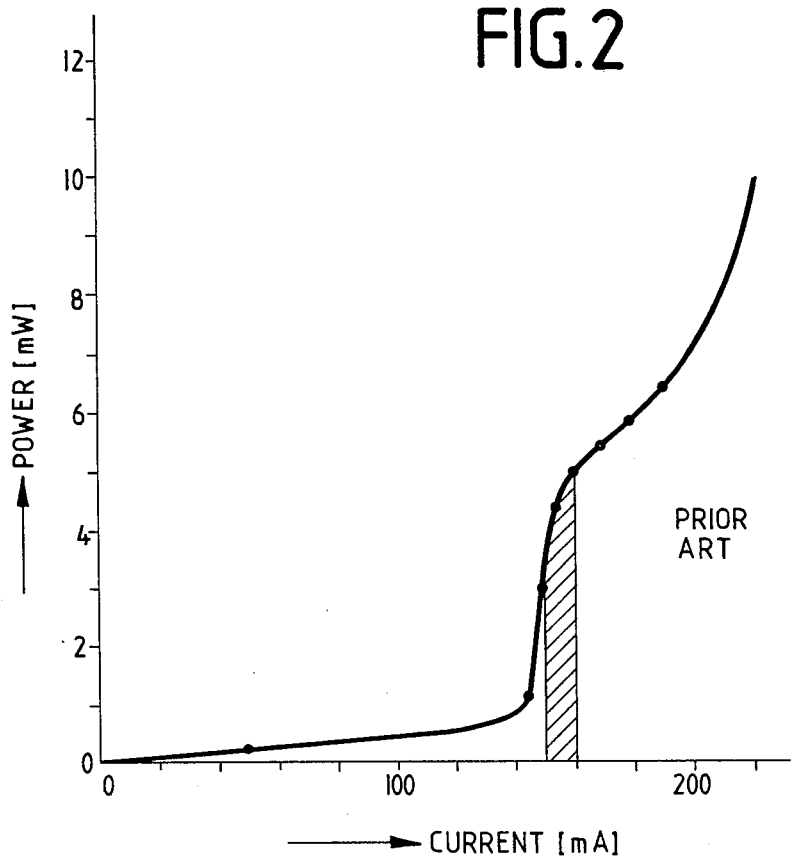
FIG. 2 is a diagram illustrating an operating characteristic of one type of prior art semiconductor laser.
Figure 3:
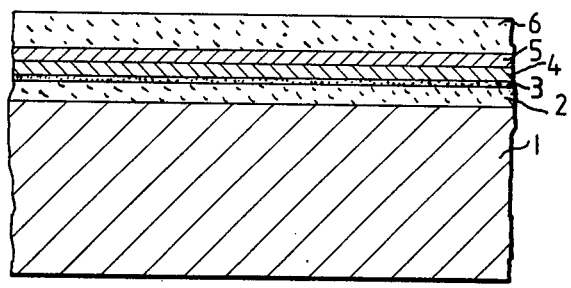
FIGS. 3-7 are cross-sectional detail views of a portion of a wafer, illustrating successive stages in the simultaneous fabrication of a plurality of semiconductor lasers according to a first preferred embodiment of the invention.

FIG. 3 shows a GaAs substrate 1 on which the layers 2,3,4,5 and 6 have been grown epitaxially, preferably by means of liquid phase epitaxy, these layers having the following composition:

Layer 1: GaAs substrate, n-type, $n < 10^{18}$ cm$^{-3}$, thickness d approximately 100 $\mu$, orientation (100).

Layer 2: $Ga_{1-x}Al_xAs$ layer, n-type, $n \sim 5 \cdot 10^{17}$ cm$^{-3}$, $d \cong 4\mu$ Layer 3: $Ga_{1-y}Al_yAs$ layer, n or p-type, $y \sim 0.05$, $d \geq 0.5\mu$, constituting the laser active zone.

Layer 4: $Ga_{1-x'}Al_{x'}As$ layer, p-type, $p \cong 5 \cdot 10^{17}$ cm$^{-3}$, $d \cong 1\mu$ Layer 5: $Ga_{1-x''}Al_{x''}As$ layer, n-type, $n \cong 10^{17}$ cm$^{-3}$, $d \cong 0.5\mu$ Layer 6: GaAs layer, n-type, $n \cong 5 \cdot 10^{17}$ cm$^{-3}$, $d \cong 2\mu$ The values given for n or p are, as is conventional, in terms of impurity atoms per cm$^{-3}$.

In this example, x was selected to be $x = x' = x'' = 0.35$. The aluminum concentration and the doping values given merely represent typical values.

The layer sequence 2,3,4 corresponds to the known double heterostructure in which laser activity occurs in layer 3 upon the injection of current.

This structure differs from the prior art double heterostructure layer sequence by the additional layer 5 and the change in the doping of layer 6 from p to n.

Figure 4:
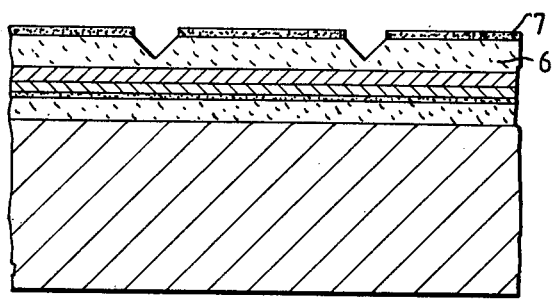
Figure 5:
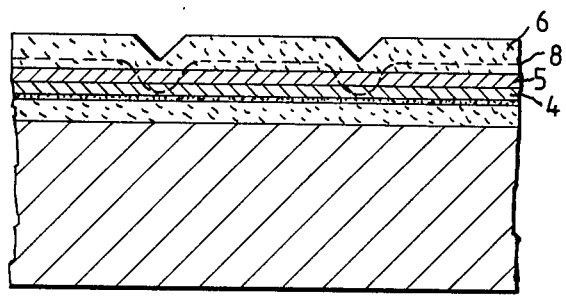

In the next step, as shown in FIG. 4, a photoresist mask 7 is applied and the mask is provided with openings, as shown, in order to permit etching of troughshaped, and preferably V-shaped grooves in layer 6. If during the exposure process to form mask 7, the exposure mask is focused on the (100) crystal surface in such a manner that the strips defining mask 7 lie parallel to one <110> direction, the sides of the etched grooves will develop in the (111) crystal planes during the subsequent etching step. These crystal faces, or groove sides, form an angle of about 55° with the (100) wafer surface. In this way it is possible to etch V-shaped grooves into the surface, as indicated in FIG. 4. A suitable etching medium for this purpose is, for example, a mixture of $H_2SO_4:H_2O_2:H_2O$ in a ratio of 1:8:40 parts per volume. In order to prevent a subsequently applied contact layer 9, shown in FIG. 6, from having a damaging influence on the layer or active zone 3, the distance of the bottom of each groove from the active zone 3 should not be substantially less than $2\mu$.

Instead of forming the grooves by a chemical etching process, as described above, the grooves may also be cut into the layer 6 by a sputter-etching process.

Each groove in layer 6 is associated with a respective semiconductor laser device.

After removal of the photoresist layer 7, zinc is diffused in according to a known method in a zinc diffusion step, for example by way of an ampul diffusion employing a zinc arsenide source, the diffusion being effected from the exposed surface of layer 6 over the entire area of the semiconductor wafer at temperatures below 700° C. Due to the particular contoured structure of the surface resulting from the presence of the grooves, the diffusion operation creates the diffusion front 8 shown in FIG. 5. The diffusion depth is selected so that the protruding portions of this front, which underlie the grooves, pass through layer 5 and partially penetrate the layer 4. A fine modification of the penetration depth as well as of the zinc profile can be effected by subsequent tempering. Due to the relatively high concentration of zinc atoms ($p \geq 5 \cdot 10^{17}$) in the regions into which zinc has been diffused, there then only exists p-type material behind front 8. In this way a narrow, p-conductive channel is formed between the upper surface of layer 6 and layer 4.

Figure 6:
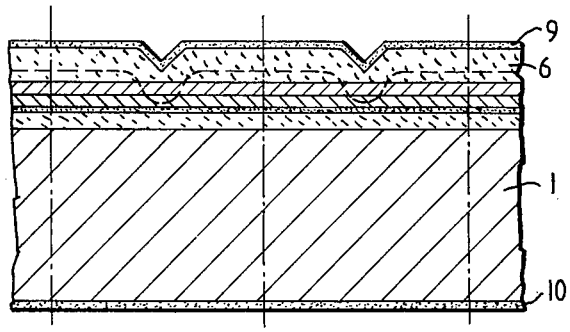

Finally, as shown in FIG. 6, ohmic contacts 9 and 10 are applied on opposite surfaces of the wafer and the crystal wafer is separated into individual laser elements each of a length of 200-400$\mu$ between separation planes. The end faces of each laser, which simultaneously form the laser mirrors, are formed by splitting the crystal perpendicular to the trough-shaped grooves and parallel to the plane of FIG. 6.

Figure 7:
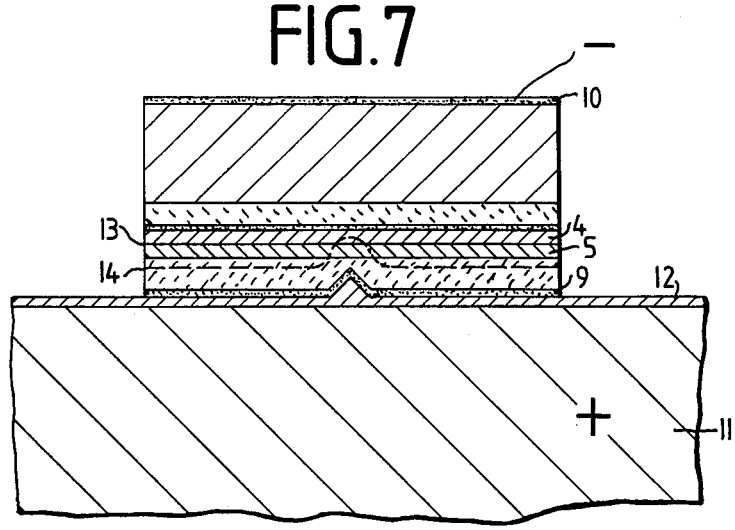

Each laser element is then soldered with its p-contact 9 down onto a gold-plated Cu heat sink 11 by means of an indium solder layer 12, as shown in FIG. 7.

If now a voltage is applied across the laser between heat sink 11 and contact 10 with the polarity shown in FIG. 7, the current in the laser can flow to the active zone 3 essentially only through the narrow p-channel formed by the protruding portion of the diffusion front and can there produce laser activity which is limited to a correspondingly narrow strip. In the side regions, away from the groove, no current can flow since the pn-junction 13 formed between layers 4 and 5 is polarized in the blocking direction.

In order to assure the blocking effect of this pn-junction, the injection of holes from the pn-junction 14, formed by the zinc diffusion and polarized in the forward direction, into the blocking pn-junction 13 to make it conductive must be prevented. In order to prevent this transistor effect in the side regions, additional layer 5 has been introduced. Due to the greater band spacing of GaAlAs compared to GaAs, a barrier is formed in the curve of the valence band at the interface between n-GaAs and n-GaAlAs and holes injected from pn-junction 14 cannot overcome this barrier.

However, current flow in the side regions can also be prevented in another way, for example by means of an insulating intermediate layer between the contact and the semiconductor surface. The pn-junction formed at the side edges of the diffusion front in the region of layer 5 is polarized in the forward direction. Current flow is prevented in that this pn-junction lies in the GaAlAs material so that, because of the higher band spacing, there results a higher diffusion voltage.

The particular structure of the semiconductor body surface results in a reduction of the width at the bottom of the current conducting channel, resulting in a favorable current distribution in the active zone. The structure according to the invention is thus equivalent to a very narrow strip contact laser whose contact strip is moreover disposed at a distance of $\geq 1\mu$ from the active zone. If, in contrast to the present invention, an alloyed contact were provided with a distance of less than $2\mu$ from the active zone it would be impossible to realize such a strip contact laser because of the adverse influence which such a contact would have to the active zone. On the other hand, a greater distance would immediately result in a considerable broadening of the current in the active zone.

Figure 8:
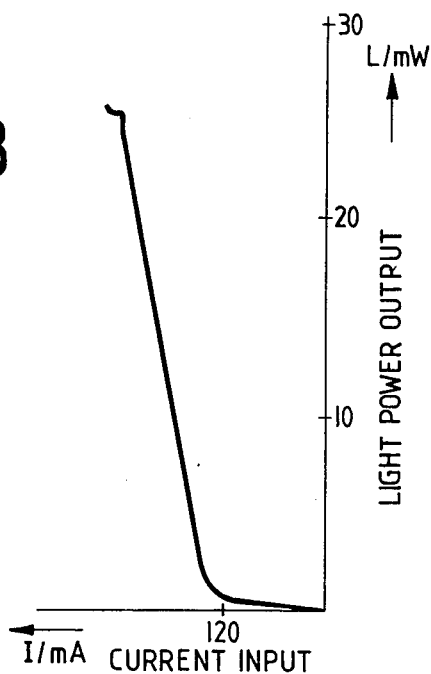
FIG. 8 is a diagram illustrating the light power output vs. current input for a first preferred embodiment of the invention.

FIG. 8 shows the light output vs. current characteristic measured at a laser according to the invention during continuous operation at room temperature. There are no signs of kinks up to a light output power of 25 mW with one mirror. With such a light output the overload of the crystalline mirror surface would already result in destruction of the laser. In order to be able to move to higher light outputs, the mirrors must be passivated by a protective layer. This passivation can be effected, for example, by a $\lambda/2$ layer of $Al_2O_3$.

Figure 9:
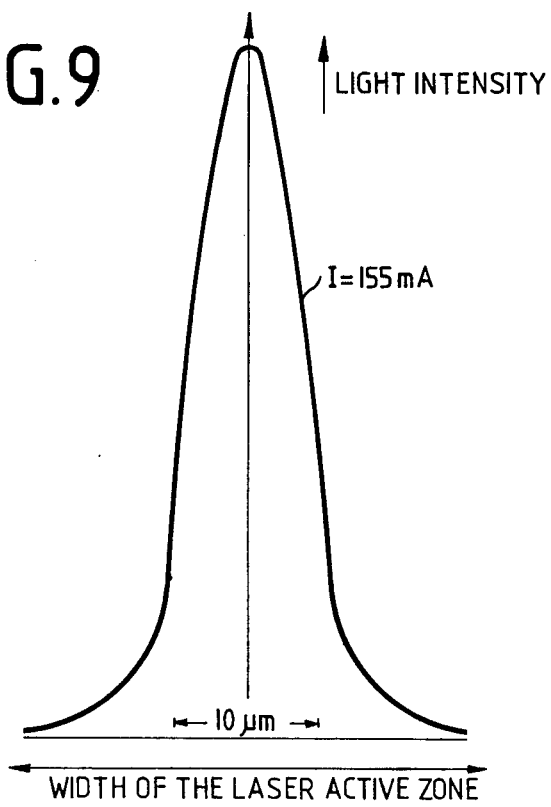
FIG. 9 is a diagram illustrating the lateral distribution of light from a laser according to the invention.

FIG. 9 shows the light intensity distribution parallel to the active zone, and perpendicular to the length of the groove in layer 6, measured at a mirror surface of a laser according to the present invention. The bell-shaped distribution curve demonstrates that the laser oscillates in the transversal basic mode. The relatively large half width of about $8\mu$ is the result of the fact that in the embodiment tested the groove has still a flat bottom with a width of $5\mu$. When a correspondingly narrower V-shaped groove with a pointed bottom is used, as indicated in FIG. 4, an optimized structure can provide short-range light distributions which are only a few $\mu$ wide at the laser mirror. When preparing the groove by etching, at first a groove with a flat bottom develops. With increasing etching depth the width of the flat bottom decreases until a V-shaped groove with a pointed bottom is achieved.

EXAMPLE 2

Figure 10:
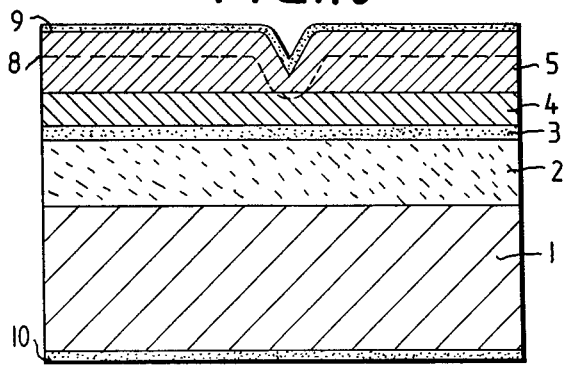
FIG. 10 is a cross-sectional view similar to that of FIG. 6, of a second preferred embodiment of the invention.

A further embodiment of the invention, shown in FIG. 10, relates to a semiconductor laser which emits in the longwave spectral range between 1.0 and $1.6\mu$. This device is formed by growing the following layer structure epitaxially on a monocrystalline InP substrate.

Layer 1: InP substrate, n-type, $n \approx 10^{18}$ cm$^{-3}$, $d \approx 100\mu$.
Layer 2: InP layer, n-type, $n \approx 10^{18}$ cm$^{-3}$, $d \approx 5\mu$.
Layer 3: $In_{1-x}Ga_xAs_yP_{1-y}$ laser active zone, n or p-type, $d \approx 0.5\mu$, $0.1 \leq x \leq 0.47$, $x/y = 0.47$
Layer 4: InP layer, p-type, $p \sim 10^{18}$ cm$^{-3}$, $d \approx 1\mu$.
Layer 5: InP layer, n-type, $n \sim 10^{18}$ cm$^{-3}$, $d \geq 2\mu$.

Based on this layer sequence, the manufacturing process is analogous to the sequence described in connection with FIGS. 3–7.

Based on its experimentally ascertained, advantageous properties, particularly with respect to low tendency to fluctuate, supplemented by a long lifetime, this device is preferably suited for use as a transmitter in optical data transmission systems.

It will be understood that the above description of the present invention is susceptible to various modifications, changes and adaptations, and the same are intended to be comprehended within the meaning and range of equivalents of the appended claims.

What is claimed is:

1. In a semiconductor laser composed of a sequence of layers forming a heterostructure diode and including a substantially homogeneously doped layer defining a laser active zone having a laser radiation exit face perpendicular to the layers, two respectively differently doped semiconductor layers disposed at respectively opposite sides of the active zone, and means for constricting the current flowing in the forward direction of the diode to a narrow, strip-shaped region in the laser active zone, the improvement wherein said laser comprises a monocrystalline layer located in the layer sequence to be spaced from said active zone by one of said differently doped semiconductor layers, with the surface of said monocrystalline layer directed away from said active zone being provided with a trough-shaped recess extending essentially perpendicularly to said radiation exit face, and a doped region extending from said surface provided with said recess toward but not into said active zone and formed by diffusion from said surface provided with said recess of a doping material which gives said doped region the same conductivity type as said one of said differently doped layers, said doped region being delimited by a diffusion front substantially parallel, and corresponding in contour, to said surface provided with said recess, and said diffusion front being located for providing a localized semiconductor region of a single conductivity type in the area below said recess and between said recess and said active zone, and semiconductive regions of respectively opposite conductivity types separated by said diffusion front in areas adjacent the localized region.

2. An arrangement as defined in claim 1 wherein said monocrystalline layer is located adjacent said one differently doped layer.

3. An arrangement as defined in claim 1 further comprising an additional semiconductor layer located adjacent each of, and interposed between, said monocrystalline layer and said one differently doped layer.

4. An arrangement as defined in claim 3 wherein said recess has a depth which is at least of the order of magnitude of its width at said monocrystalline layer surface in which said recess is provided.

5. An arrangement as defined in claim 4 wherein said width of said recess is less than $3\mu$.

6. An arrangement as defined in claim 5 wherein said recess has essentially a V-shape.

7. An arrangement as defined in claim 6 wherein the distance between the bottom of said recess and said active zone is not less than $2\mu$.

8. An arrangement as defined in claim 3, 6 or 7 wherein: said laser comprises an n-type GaAs substrate; the other one of said differently doped layers is disposed on said substrate and is composed of an n-type $Ga_{1-x}Al_xAs$ material; said layer defining said laser active zone is composed of a $Ga_{1-y}Al_yAs$ material; said one differently doped layer is composed of a p-type $Ga_{1-x'}Al_{x'}As$ material; said additional layer is of a $Ga_{1-x''}Al_{x''}As$ material having an n-type conductivity in the absence of said doping material; said monocrystalline layer is composed of a GaAs material having an n-type conductivity in the absence of said doping material; $x, x', x''$ and $y$ are positive numbers less than 1; and $x, x'$ and $x''$ are each greater than $y$.

9. An arrangement as defined in claim 2, wherein: said laser comprises an n-type InP substrate; the other one of said differently doped layers is disposed on said substrate and is compared of an n-type InP material; said layer defining said laser active zone is composed of an $In_{1-x}Ga_xAs_yP_{1-y}$ material, where $x$ and $y$ are positive numbers, $x$ is less than 1 and $y$ is no greater than 1; said one differently doped layer is composed of a p-type InP material; and said monocrystalline layer is composed of an InP material having an n-type conductivity in the absence of said doping material.

10. Method for producing a semiconductor laser as defined in claim 2 or 3 comprising growing said monocrystalline layer above said one differently doped semiconductor layer, placing on said monocrystalline layer an etching mask having a strip-shaped opening extending essentially perpendicular to said radiation exit face, performing an etching process on the surface of said monocrystalline layer exposed by said opening to remove material from said monocrystalline layer down to crystal planes which extend parallel to the openings in the mask and together form said trough-shaped recess, diffusing said doping material through the entire said surface of said monocrystalline layer while maintaining process conditions which give the diffusion front its defined location, and providing said laser with electrodes for the application of excitation current.

11. Method as defined in claim 10 wherein a large number of parallel trough-shaped recesses are formed in the surface of said monocrystalline layer, the spacing between said recesses corresponding to the width of an individual laser, and, after said steps of diffusing and providing electrodes, dividing said sequence of layers into a plurality of individual lasers.

12. An arrangement as defined in claim 2 wherein said recess has a depth which is at least of the order of magnitude of its width at said monocrystalline layer surface in which said recess is provided.

13. An arrangement as defined in claim 12 wherein said width of said recess is less than $3\mu$.

14. An arrangement in claim 13 wherein said recess has essentially a V-shape.

15. An arrangement as defined in claim 14 wherein the distance between the bottom of said recess and said active zone is not less than $2\mu$.

* * * * *